(12) United States Patent
Windley et al.

(10) Patent No.: US 9,680,458 B1
(45) Date of Patent: Jun. 13, 2017

(54) INPUT-CONTROLLED MULTIPLE THRESHOLD DEBOUNCE SYSTEM

(71) Applicant: Schweitzer Engineering Laboratories, Inc., Pullman, WA (US)

(72) Inventors: Tracey G. Windley, Moscow, ID (US); Veselin Skendzic, Schwenksville, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 15/234,303

(22) Filed: Aug. 11, 2016

(51) Int. Cl.
| | |
|---|---|
| *H03K 17/16* | (2006.01) |
| *H03K 5/1254* | (2006.01) |
| *H03K 19/20* | (2006.01) |
| *H03K 21/02* | (2006.01) |
| *H03K 5/00* | (2006.01) |

(52) U.S. Cl.
CPC ........... *H03K 5/1254* (2013.01); *H03K 19/20* (2013.01); *H03K 21/026* (2013.01); *H03K 2005/00019* (2013.01)

(58) Field of Classification Search
CPC .... H03K 5/1254; H03K 21/026; H03K 19/20; H03K 2005/00019
See application file for complete search history.

(56) References Cited

U.S. PATENT DOCUMENTS

| | | | | | |
|---|---|---|---|---|---|
| 4,549,094 A | * | 10/1985 | Floyd | ................... | H03K 5/1252 326/82 |
| 4,594,724 A | * | 6/1986 | Hogan | .................... | H04L 12/42 327/385 |
| 5,059,834 A | * | 10/1991 | Tago | ...................... | H03K 5/135 326/21 |
| 5,208,545 A | | 5/1993 | Schweitzer | | |
| 5,315,539 A | | 5/1994 | Hawes | | |
| 5,672,919 A | | 9/1997 | Johnson | | |
| 5,878,006 A | * | 3/1999 | Jung | ................... | G11B 7/08541 369/44.28 |
| 6,670,831 B2 | * | 12/2003 | Mashimo | ............... | G11B 20/10 327/34 |
| 7,506,810 B2 | * | 3/2009 | Whaley | ................ | G06K 7/0021 235/441 |

(Continued)

FOREIGN PATENT DOCUMENTS

WO      2012028211      3/2012

*Primary Examiner* — Kenneth B Wells
(74) *Attorney, Agent, or Firm* — Jared L. Cherry; Richard M. Edge

(57) ABSTRACT

Disclosed herein are various implementations of input-controlled multiple threshold debounce circuits or algorithms. In one embodiment, an input-controlled multiple threshold debounce system is configured to receive an input signal and to control an output. An analysis subsystem may determine when an input signal exceeds an assertion threshold and may assess at least one additional characteristic of the input signal. Supervisory logic in communication with the analysis subsystem may select a variable delay based on the at least one additional characteristic of the input signal. A delay subsystem controlled by the supervisory logic may assert a first signal after the input signal remains above the assertion threshold for longer than the variable delay. Finally, a system output may be configured to receive the first signal and may be configured to assert the debounce system output based on the first signal.

18 Claims, 4 Drawing Sheets

(56) References Cited

U.S. PATENT DOCUMENTS

| | | | |
|---|---|---|---|
| 7,579,894 B2 * | 8/2009 | Kejriwal | H03K 5/1252 327/34 |
| 7,698,582 B2 | 4/2010 | Qin | |
| 8,102,285 B2 * | 1/2012 | Vile | H03K 5/1254 341/24 |
| 8,502,593 B2 * | 8/2013 | Lu | H03K 5/1254 327/34 |
| 8,558,606 B2 * | 10/2013 | Chen | H03K 5/1254 327/309 |
| 9,484,899 B2 * | 11/2016 | Todd | H03K 5/1254 |

\* cited by examiner

INPUT-CONTROLLED MULTIPLE THRESHOLD DEBOUNCE SYSTEM

TECHNICAL FIELD

This disclosure relates to systems and methods for implementing an input-controlled multiple threshold debounce circuit using two or more thresholds, and two or more corresponding delays between detection of a transition at the input and the change of an output.

BRIEF DESCRIPTION OF THE DRAWINGS

Non-limiting and non-exhaustive embodiments of the disclosure are described, including various embodiments of the disclosure with reference to the figures included in the detailed description.

DETAILED DESCRIPTION

Figure 1A:
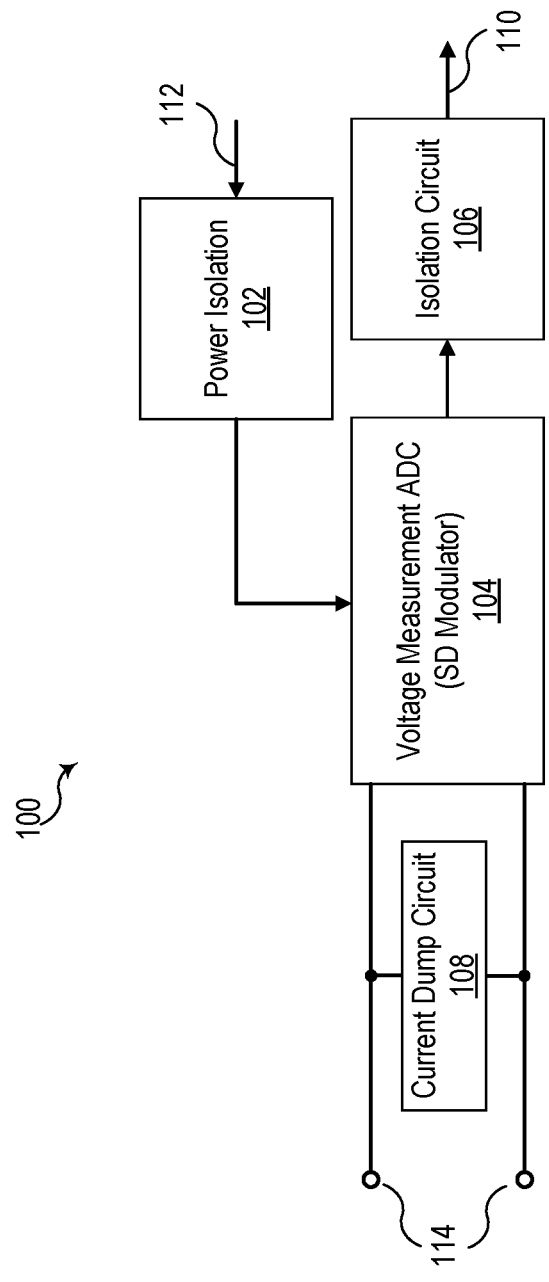
FIG. 1A illustrates a functional block diagram of an input circuit consistent with embodiments of the present disclosure.

This disclosure relates to systems and methods for implementing debounce circuits using two or more thresholds, signal filtering and two or more corresponding delays between detection of a transition and the change of an output. In various embodiments the teachings of the present disclosure may be applied to input circuits, including universal digital inputs ("UDI"). In such circuits, the transition from a deasserted state to an asserted state may be controlled by comparing an input to an assertion threshold; however, mechanical fluctuations of the device monitored by the UDI or noise at the input circuit may cause the input to fluctuate above and below the threshold. Traditionally, accuracy in detecting legitimate transitions and rejecting an unwanted transient signal may be improved by requiring that an input remain above an assertion threshold for a specified period of time. For example, a counter may be started when the input signal crosses the threshold. If the input reverts to its original state due to mechanical bounce or noise in the input signal, the counter may be reset. When the input signal changes state again, the counter may begin again. Thus, the counter only reaches a specified count (or delay) and asserts its output after the input has remained in the same state for a sufficient duration, namely a debounce time. In other words, the output changes state only if the input state remains stable following a transition for a period of time longer than the debounce time. Using this approach, increasing the transition speed of a circuit (i.e., a delay between a change at the input and a change at the output) may adversely affect the circuit's tolerance for noise; while increasing the tolerance for mechanical bounce or noise may adversely affect the speed of the circuit.

In one specific application, the embodiments of the present disclosure may be utilized in electrical power systems, and may be subjected to specific compliance tests or exposed to power system generated high frequency transients. In some applications, certain input signals may be controlled by large electromechanical contacts that are prone to bounce and oscillations. Further, such inputs may include significant noise. Electrical power systems are critical infrastructure and may be subjected to significant testing to ensure reliable operation. In such testing, a signal with significant mechanical oscillations and/or electrical noise may be used as an input, and as such, a debounce circuit may be used to discriminate between legitimate transitions and transitions caused by mechanical oscillations or noise in the signal. Compliance with the tests may be achieved by starting a counter once the input exceeds an assertion threshold and only transitioning an output at the expiration of the counter. In one specific embodiment, a short delay between a transition on the input and the output on the order of between 10-100 µs may be implemented when the input signal satisfies specific criteria indicating a well-defined transition between states. A longer delay between the transition on the input and the output on the order of between 1-3 ms may be implemented when the input signal does not satisfy the specific criteria. Of course, in other embodiments, the delay may be greater than or shorter than the specific ranges associated with this specific embodiment. In various embodiments consistent with the present disclosure, a debounce circuit may be configured to transition an output rapidly (e.g., on the order of microseconds) when the input signal satisfies specific criteria and more slowly (e.g., on the order of milliseconds) when the input signal fails to satisfy the specific criteria while still complying with the substation EMC environment and the tests required for electrical power system equipment.

In various embodiments consistent with the present disclosure, a debounce circuit may measure characteristics of the input voltage waveform and may apply differing thresholds based on the characteristics. Specifically, various techniques are disclosed herein that may aid in the detection of legitimate assertions/deassertions and those caused by transients. Various embodiments consistent with the present disclosure may assess input waveforms and apply analog or digital filtering, various thresholds and delays to differentiate between transient signals and legitimate assertions/deassertions. In various embodiments, a high sampling rate may be utilized in comparison to an output rate to achieve a desired level of precision. In various embodiments, a sampling rate in the range of megahertz may be used, and an output rate in the range of kilohertz may be used. Such ranges may be suitable for protection and/or automation of electrical power systems. An output rate in the range of 10 kHz would enable a protective relay operating in an electrical power system to implement a protection rate of 10 kHz. Such a high protection rate may enable increased reliable protection and/or safety in the operation of electrical power systems.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be implemented as software modules or components. As used herein, a software module or component may include any type of computer instruction or computer executable code located within a memory device and/or transmitted as electronic signals over a system bus or wired or wireless network. It may also include any hardware instances defined using programmable logic languages and executed on a Field Programmable Logic Array (FPGA) or analog processing hardware. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory computer and/or machine-readable medium having stored thereon instructions that may be used to program a computer (or other electronic device) to perform processes described herein. For example, a non-transitory computer-readable medium may store instructions that, when executed by a processor of a computer system, cause the processor to perform certain methods disclosed herein. The non-transitory computer-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of machine-readable media suitable for storing electronic and/or processor executable instructions.

FIG. 1A illustrates a block diagram of an input circuit 100 consistent with embodiments of the present disclosure. A power isolation circuit 102 may comprise a power input 112 to power the input circuit 100. Power isolation circuit 102 may be configured to isolate the input circuit 100 from signals in the supply power (e.g., the fundamental frequency of the power supply and harmonics, transient signals, etc.). In an alternate embodiment, operating power may be extracted from the input circuit itself, thus lowering the cost and removing the need to supply the operating power across the high voltage isolation barrier.

An input 114 may receive an input, which in various embodiments may comprise a digital signal. A current dump circuit 108 may be associated with the input 114. Current dump circuit 108 ensures that the monitored signal has sufficient energy to be considered for valid circuit activation. Current dump circuit is in charge of consuming a preprogrammed amount of current while the inputs are active (i.e. 1 to 10 mA); and may when desired, require much higher initial current (i.e. 50 mA to 900 mA) before allowing the UDI circuit to declare a valid transition from the deenergized to enegized state.

Input circuit 100 includes a voltage measurement analog-to-digital converter ("ADC") embodied as a sigma-delta (ΣΔ) modulator 104. ΣΔ modulator 104 may encode analog signals into digital signals and transfer high bit-count low resolution frequency digital signals into lower bit-count higher resolution frequency digital signals. ΣΔ modulator 104 may create a delta modulation of an input signal. The delta modulation may represent the change in the input signal, rather than an absolute value. The delta modulation is a stream of pulses. The accuracy of the modulation may be improved by passing the modulator digital output through a 1-bit DAC and adding (sigma) the resulting analog signal to the input signal, thereby reducing the error introduced by the delta-modulation. Alternate embodiments may replace the ADC measurement block with single comparators set to assert at pre-programmed thresholds to emulate the ADC function at lower cost. An isolation circuit 106 may isolate an output 110 of the input circuit from any other circuit in electrical communication with the output 110. In various embodiments, input circuit 100 may be a part of a debouce system consistent with the present disclosure.

Figure 1B:
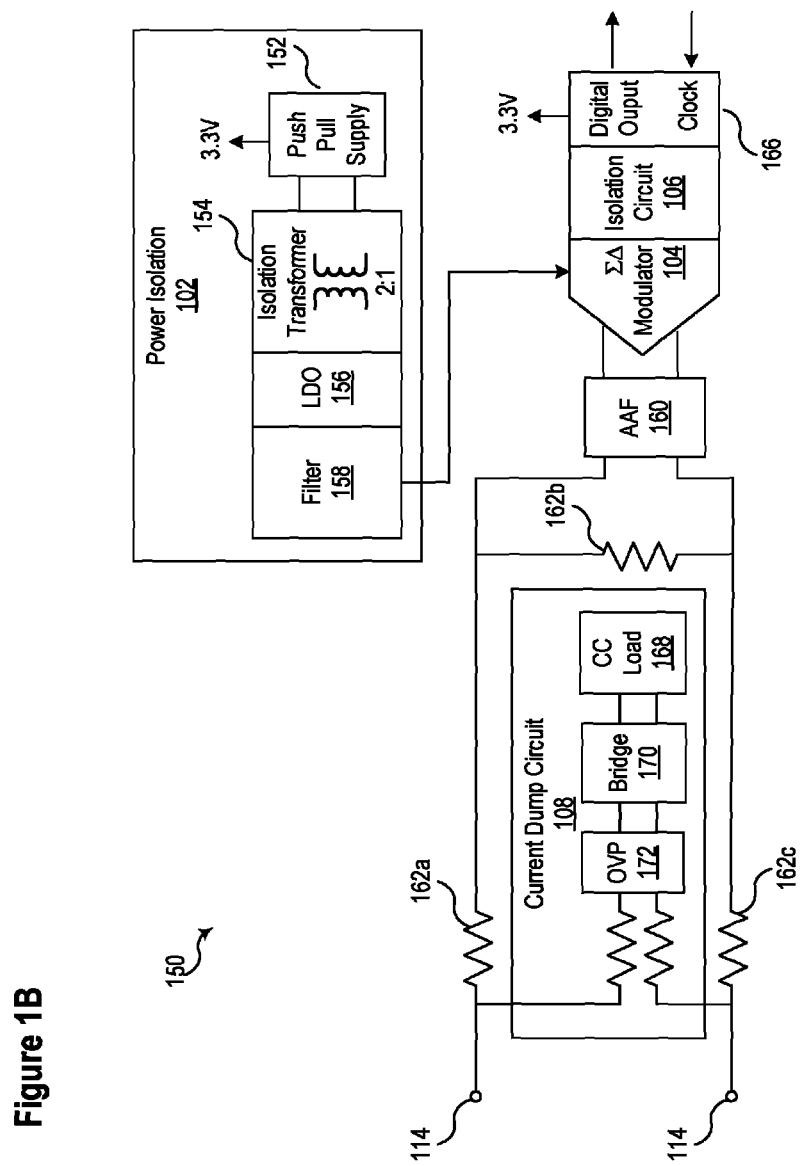
FIG. 1B illustrates a detailed functional block diagram of an input circuit consistent with embodiments of the present disclosure.

FIG. 1B illustrates a detailed functional block diagram of an input circuit 150 consistent with embodiments of the present disclosure. Power isolation 102 may comprise a forward push-pull supply 152. In one embodiment, the push-pull supply 152 may operate at about 300-500 kHz. An isolation transformer 154 may transfer electrical energy from the push-pull supply 152 while isolating the powered device from the push-pull supply 152. Isolation transformer 154 may provide suppress electrical noise suppression and provide galvanic isolation. A low drop out (LDO) regulator 156 may effectively regulate the output voltage even when the supply voltage is close to the output voltage. A low pass filter 158 may produce a low ripple output that is provided to the ΣΔ modulator 104.

Input 114 is connected to a resistor divider network 162. The values of the individual resistors 162a, 162b, and 162c, may be selected to provide a high input impedance and a large divider ratio. In one embodiment, the resistor divider may scale an input voltage of ±450 volts to ±250 mV. The input signal may pass through an anti-alias filter (AAF) 160. In some embodiments, the AAF 160 may comprise a passive filter, minimizing the number of active components required on the isolated side. The output of the AAF 160 may be provided to the ΣΔ modulator 104. In some embodiments, the ΣΔ modulator 104 may not produce a full multi-bit digital word. Rather, the modulator stream may be filtered to produce the digital word. Using this approach, only single bit conversions are transferred across the isolation circuit 106 at a time. In such an embodiment, there is no digital word most-significant bit because decimation and averaging may occur outside of the input circuit 150. This makes the circuit more resilient to single bit disturbances caused by transients. Further, different resolution accuracies can be produced from the same modulator data stream depending on the selected over sampling ratio and digital filter type. In one specific embodiment, a clock input 166 may be 20 MHz, the ΣΔ modulator 104 may use an over sampling ratio of 20, and may produce an effective data rate resolution of 8 bits at 1 MHz. The AAF corner frequency is set to approximately 1 MHz. This same stream could also be decimated further to produce 16-bit resolution at 10 kHz. Using this data, various embodiments consistent with the present disclosure may implement debounce functions that simultaneously allow for high accuracy, robust protection against EMC transients and for high speed operation.

Depending on the implementation; the current dump circuit 108 may include an overvoltage protection circuit 172, a bridge rectifier circuit 170, and a constant current load 168. Other methods for achieving bipolar operation may also be utilized in various embodiments.

Figure 2A:
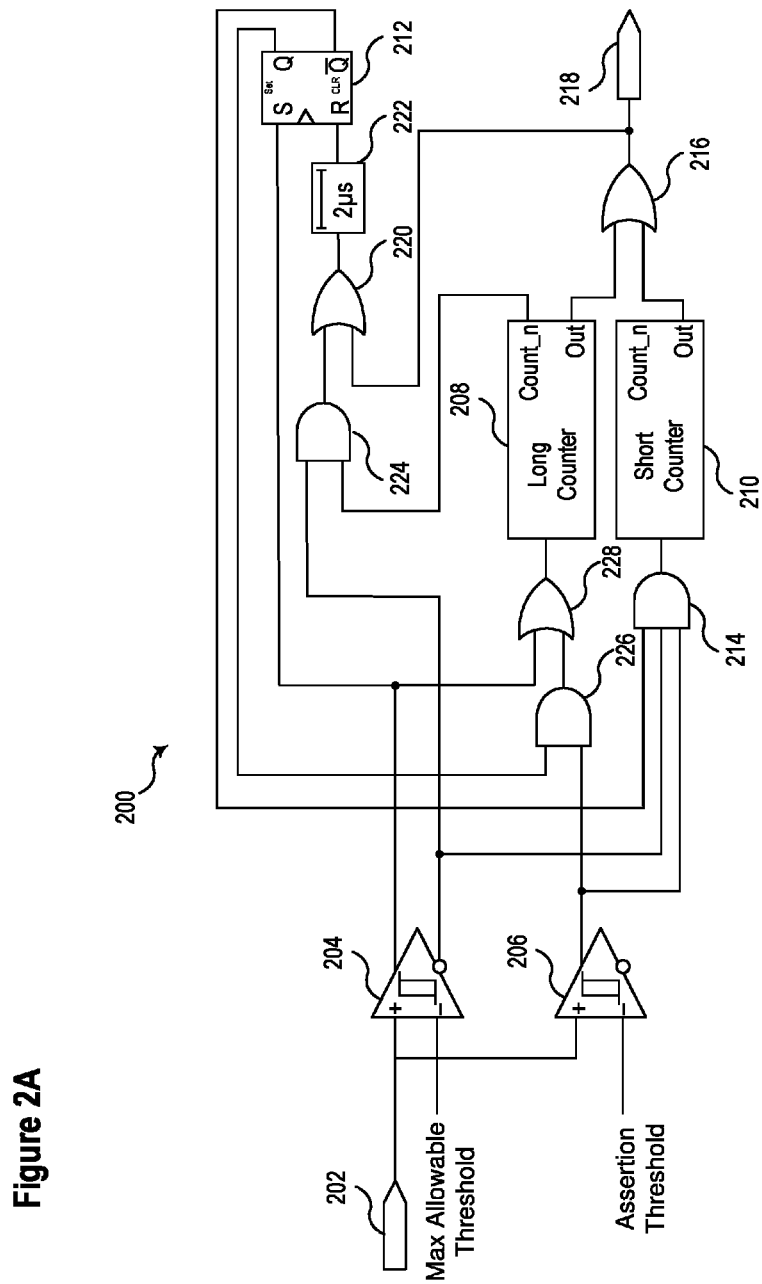
FIG. 2A illustrates a logic diagram of a debounce system in which an input signal is compared to an assertion threshold of a maximum allowable threshold to selectively activate either a long counter or a short counter consistent with embodiments of the present disclosure.

FIG. 2A illustrates a logic diagram of a debounce system 200 in which an input signal is compared to an assertion threshold and to a maximum allowable threshold to selectively activate either a long counter 208 or a short counter 210 consistent with embodiments of the present disclosure. In various embodiments, long counter 208 and short counter 210 may be embodied as up/down counters. In some embodiments, the up/down counters may count-up and count-down at different speeds. In other words, the time required for a counter to count-up may differ from the time required for a counter to count-down. In some embodiments, the count-up time may exceed the count-down time, while in other embodiments, the count-down time may exceed the count-up time. Although FIG. 2A illustrates one specific and detailed embodiment, a variety of other embodiments may be utilized. In the illustrated embodiment, an input signal may be received by an input 202. In one specific embodiment, input 202 may be embodied as input circuit 100 or input circuit 150, as illustrated in FIG. 1A and FIG. 1B, respectively. Returning to a discussion of FIG. 2A, input 202 may also be embodied by other input circuits. Various embodiments may be configured for use with an input circuit configured to generate a representation of instantaneous voltage measurements using a ΣΔ modulator and a follow up decimation filter, or a variety of other ADC inputs. A maximum allowable threshold and an assertion threshold may also be inputs or static values in various embodiments. The input 202, the maximum allowable threshold, and the assertion threshold are inputs to comparators 204 and 206.

The signals generated by comparators 204 and 206 may indicate whether the input 202 is (1) below the assertion threshold, (2) above the assertion threshold and below the maximum allowable threshold, or (3) above both the assertion threshold and the maximum allowable threshold. The different thresholds may enable different delays between a change in an input and a change in the output based on the assumption that legitimate transitions exhibit a well-defined transition with limited overshoot. Signals exhibiting a well-defined transition may be permitted to generate higher speed transitions in the output 218 than transitions that are not well-defined. In one embodiment, debounce system 200 may operate at 125 V, the assertion threshold may be 85 V, and the maximum allowable overshoot threshold may be between 200-300 V to provide some margin for legitimate turn-on transitions with overshoot.

While input 202 exceeds the assertion threshold but is below the maximum allowable threshold, all of the inputs of AND gate 214 are asserted. The output of AND gate 214 may enable a short counter 210. In one specific embodiment, the short counter 210 has a delay ranging from 10-100 μs. The short counter 210 may remain enabled while the input 202 remains above the assertion threshold and below the maximum allowable threshold. Once the time delay represented by the short counter 210 has elapsed, an output of the short counter 210 may be enabled. The output of the short counter 210 may be connected to an input of OR gate 216, and accordingly, may affect an output 218 of debounce system 200. The output of OR gate 216 may also be connected to an input of OR gate 220. A delay circuit 222 may impose a delay of 2 μs before triggering a reset of SR latch 212. Resetting SR latch 212 changes one of the input of AND gate 214 connected to the Q output of the SR latch 212.

While input 202 exceeds both the assertion threshold and the maximum allowable threshold, a long counter 208 may be enabled. In one specific embodiment, the long counter 208 may have a delay ranging between 1-3 ms. The long counter 208 may remain enabled while the input 202 remains above the assertion threshold and above the maximum allowable threshold. Once the time delay represented by the long counter 208 has elapsed, an output of the long counter 208 may be enabled. The output of the long counter 208 may be connected to the input of OR gate 216, and accordingly, may affect the output 218 of debounce system 200. As described above, the assertion of the output of OR gate 216 may result in the assertion of the reset input of SR latch 212. The use of the Q and Q' outputs of the SR latch 212 as inputs to AND gates 226 and 214, respectively, may ensure that the long counter 208 and the short counter 210 are mutually exclusive.

Debounce system 200 also includes AND gates 224 and 226 and OR gate 227, which may ensure that the long counter 208 is activated and remains active once the input signal 202 exceeds the max allowable threshold. The "Count_n" output of long counter 208 may be asserted while long counter 208 is active. In some embodiments, long counter 208 may remain active, and short counter 210 may remain inactive, until long counter 208 either asserts its output or fully counts down to zero and resets the SR latch 212.

Debounce circuit 200 may selectively apply the delay corresponding to the long counter 208 or the delay corresponding to the short counter 210 based on the value of the input 202 with respect to the assertion threshold and the maximum allowable threshold. In some embodiments, the maximum allowable threshold may be selected to reflect a measure of noise in the input system. For example, the maximum allowable threshold may reflect a high signal-to-noise ratio in the input signal. Accordingly, the noise in the signal may cause the input to exceed the maximum allowable threshold, the input signal will exceed the maximum allowable threshold, and the debounce system 200 may require that the input signal exceed the assertion threshold for at least as long as the delay introduced by the long counter 208 before changing the output 218. In contrast, when there is relatively little noise in the signal, and thus the input signal remains below the maximum allowable threshold, the system may require that the input signal exceed the assertion threshold for only as long as the delay introduced by the short counter 210 before changing the output 218. In various embodiments, debounce system 200 may be implemented using an FPGA or other logic device.

Debounce circuit 200 selectively enables transitions of the output based on the long counter 208 or the short counter 210 based on whether the input signal exceeds a maximum allowable threshold. In other embodiments, additional criteria associated with input 202 may also be assessed to determine whether a shorter or longer period should control transitions of the output 218. For example, the rate of change of the signal may also provide an indication, in some embodiments, of whether a transition is a legitimate assertion or reflects mechanical oscillations or noise associated with the input. In some embodiments, signal integration intended to simulate behavior (e.g., current flow through) of a solenoid load may be used as well.

Figure 2B:
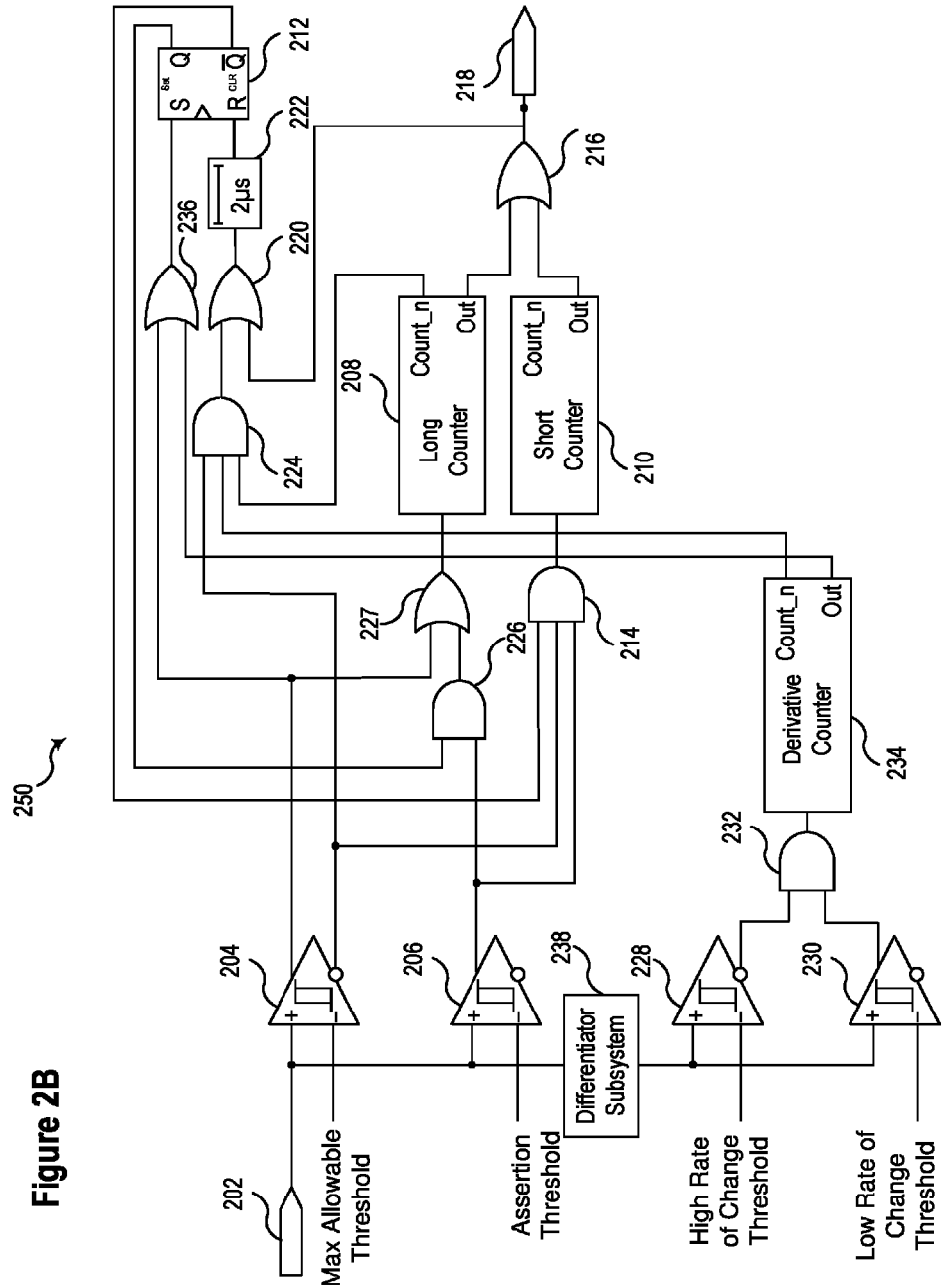
FIG. 2B illustrates a logic diagram of a debounce system in which an input signal is compared to an assertion threshold of a maximum allowable threshold, and in which the rate of change of the input signal is compared to a high rate of change threshold and a low rate of change threshold to selectively activate either a long counter or a short counter consistent with embodiments of the present disclosure.

FIG. 2B illustrates a logic diagram of a debounce system 250 in which an input signal 202 is compared to an assertion threshold and to a maximum allowable threshold, and in which the rate of change of the input signal 202 is compared to a high rate of change threshold and a low rate of change threshold to selectively activate either a long counter 208 or a short counter 210 consistent with embodiments of the present disclosure. A variety of input conditions may arise that are not legitimate transitions, but that would not necessarily exceed the maximum allowable threshold. For example, a capacitive discharge of the input signal may not correspond to a legitimate transition, but such a scenario would also not result in the input signal overshooting the maximum allowable threshold.

Debounce system 250 may compare the rate of change (i.e., the derivative) of input 202 to a high rate of change threshold and a low rate of change threshold. The rate of change of the input signal 202 may be determined using differentiator subsystem 238. The output of differentiator subsystem 238 may be compared to the high rate of change threshold and the low rate of change threshold by comparators 228 and 230. The outputs of the comparators 228 and 230 are inputs to AND gate 232, which in turn may activate a derivative counter 234. The "Out" and "Count_n" signals generated by derivative counter 234 may control SR latch 212. If the output of the differentiator subsystem 238 is between the high rate of change and the low rate of change thresholds for longer than the duration of the derivative counter, the long counter 208 is activated. In one specific embodiment, the derivative counter 234 may have a delay equal to approximately half of the delay of the short counter. For example, if the short counter 210 has a delay of 50 µs, the derivative counter 234 may have a delay of 25 µs.

Returning to the discussion of the capacitive discharge example described above, the high rate of change and the low rate of change thresholds may be selected to reject the capacitive discharge event. Comparators 228 and 230 may create a window comparator function that identifies slow moving signals (e.g., rate of change thresholds in the range of 20 to 1000 V/µs). Appropriate values for the high rate of change and the low rate of change thresholds may be selected for various applications, and in some embodiments, may be varied based on conditions associated with debounce system 250.

In various embodiments, the functions performed by comparators 204, 206, 228, and 230 may be performed by an analysis subsystem. An analysis subsystem may be configured to analyze the input signal with respect to multiple thresholds. In the specifically illustrated embodiment, the thresholds include the maximum allowable threshold, the assertion threshold, the high rate of change threshold, and the low rate of change threshold. In other embodiments, other parameters associated with an input signal may be analyzed, such as frequency, current, etc. In the illustrated embodiments, comparators are used to assess the input signal with respect to a threshold; however, in other embodiments, the analysis may be performed in other ways. For example, more complicated analog or digital signal processing techniques may be used to assess parameters of an input signal.

The control functions implemented by the various logic gates and the SR latch 212 may be achieved using a variety of components and configurations, any of which may be referred to generally as supervisory logic. The specific implementation illustrated is merely representative of a variety of possible supervisory logic implementations. In other embodiments, the supervisory logic may be configured to select and/or enable two or more delays between a transition of the input signal and a system output based on the analysis of the input signal performed by the analysis subsystem.

Delays implemented by long counter 208, short counter 210, and derivative counter 234 may be effected by a variety of types of components, any of which may be referred to generically as a delay subsystem. The delay subsystem may be configured to apply an appropriate delay based on an output of the analysis subsystem. In the specifically illustrated embodiment, the delays are all implemented by counters; however, in other embodiments, other techniques may be used. In some embodiments, the delays may be variable based on specific characteristics of the input. For example, the difference between a short delay and a long delay may be proportionate to the amount by which the input signal exceeds a specified threshold. In this example, a larger delay may be imposed if the input signal significantly overshoots the maximum assertion threshold, and a shorter delay may be imposed if the input signal only slightly overshoots the maximum assertion threshold.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

The invention claimed is:

1. An input-controlled multiple threshold debounce system configured to receive an input signal, a maximum allowable threshold and an assertion threshold, and to control a debounce system output, the debounce system comprising:
 a first comparison subsystem configured to assert a first signal when the input signal is greater than the assertion threshold;
 a second comparison subsystem configured to assert a second signal when the input signal is greater than the maximum allowable threshold;
 a first delay subsystem selectively enabled when the first signal is asserted and the second signal is deasserted, and configured to assert a first output after a first delay and while the input signal is greater than the assertion threshold; and
 a second delay subsystem selectively enabled when the first signal is asserted and the second signal is asserted, and configured to assert a second output after a second delay and while the input signal is greater than the assertion threshold, the second delay being longer than the first delay; and a debounce system output configured to assert based on one of the first output and the second output.

2. The input-controlled multiple threshold debounce system of claim 1, further comprising:
a differentiator subsystem configured to determine a rate of change of the input signal;
a third comparison subsystem configured to assert a third signal when the rate of change of the input signal is below a first rate of change threshold and when the rate of change is above a second rate of change threshold;
wherein the second delay subsystem is selectively enabled when the third signal is asserted.

3. The input-controlled multiple threshold debounce system of claim 2, wherein the first delay subsystem is disabled when the third signal is asserted.

4. The input-controlled multiple threshold debounce system of claim 2, wherein the first rate of change threshold and the second rate of change threshold correspond to inputs of the debounce system.

5. The input-controlled multiple threshold debounce system of claim 2, further comprising a third delay subsystem selectively enabled when the rate of change of the input signal is below the first rate of change threshold and when the rate of change is above the second rate of change threshold, the third delay subsystem configured to delay the assertion of the third signal by a third delay.

6. The input-controlled multiple threshold debounce system of claim 5, wherein the third delay is shorter than the first delay.

7. The input-controlled multiple threshold debounce system of claim 1, wherein the second delay subsystem comprises an up/down counter and the up/down counter is:
configured to count up when the first signal is asserted and the second signal is asserted;
configured to begin to count down when the second signal becomes deasserted; and
configured to selectively disable the first delay subsystem while the up/down counter both counts up and counts down.

8. The input-controlled multiple threshold debounce system of claim 7, wherein the up/down counter is configured have a count-up speed and a count-down speed, and wherein the count-up speed and the count-down speed are different.

9. The input-controlled multiple threshold debounce system of claim 1, wherein the second delay subsystem remains enabled when the first signal is asserted and the second signal is asserted, and is configured to assert the second output after the second delay and after the input signal exceeds the assertion threshold.

10. The input-controlled multiple threshold debounce system of claim 1, further comprising an input circuit configured to receive the input signal and in electrical communication with the first comparison subsystem and the second comparison subsystem.

11. The input-controlled multiple threshold debounce system of claim 10, wherein the input circuit is configured to electrically isolate the input-controlled multiple threshold debounce system from an electrical power system associated with the input signal.

12. The input-controlled multiple threshold debounce system of claim 10, wherein the input circuit comprises a delta-sigma modulator configured to create a digital representation of an analog input.

13. The input-controlled multiple threshold debounce system of claim 1, wherein the input signal is configured to be sampled at a sampling rate on the order of twenty megahertz and an output rate is on the order of ten kilohertz.

14. An input-controlled multiple threshold debounce system configured to receive an input signal and to control a debounce system output, the debounce system comprising:
an analysis subsystem configured to determine when the input signal exceeds an assertion threshold and to assess at least one additional characteristic of the input signal;
supervisory logic in communication with the analysis subsystem and configured to select a variable delay, the length of the variable delay being based on the at least one additional characteristic of the input signal;
a delay subsystem controlled by the supervisory logic and configured to assert a delay subsystem output after the input signal remains above the assertion threshold for longer than the variable delay;
a debounce system output configured to assert based on the delay subsystem output.

15. The input-controlled multiple threshold debounce system of claim 14, further comprising:
a differentiator subsystem configured to determine a rate of change of the input signal;
wherein the supervisory logic is further configured to select the variable delay based on the rate of change of the input signal.

16. The input-controlled multiple threshold debounce system of claim 14, further comprising an input circuit configured to receive the input signal.

17. The input-controlled multiple threshold debounce system of claim 14, wherein the input signal is configured to be sampled at a sampling rate on the order of megahertz and an output rate is on the order of kilohertz.

18. An input-controlled multiple threshold debounce system configured to receive an input signal associated with an electrical power system and to control a debounce system output, the debounce system comprising:
an input circuit configured to:
electrically isolate the input-controlled multiple threshold debounce system from the electrical power system associated with the input signal;
create a representation of the input signal;
an analysis subsystem configured to:
receive the representation of the input signal;
determine when the representation of the input signal exceeds an assertion threshold;
assess at least one additional characteristic of the input signal;
a differentiator subsystem configured to determine a rate of change of the input signal;
supervisory logic in communication with the analysis subsystem and the differentiator subsystem and configured to select a variable delay, the length of the variable delay being based on and rate of change of the input signal and the at least one additional characteristic of the input signal;
a delay subsystem controlled by the supervisory logic and configured to assert a delay subsystem output after the input signal remains above the assertion threshold for longer than the variable delay; and,
a debounce system output configured to assert based on the delay subsystem output.

* * * * *